United States Patent
Hsu et al.

(10) Patent No.: US 7,485,940 B2
(45) Date of Patent: Feb. 3, 2009

(54) GUARD RING STRUCTURE FOR IMPROVING CROSSTALK OF BACKSIDE ILLUMINATED IMAGE SENSOR

(75) Inventors: Tzu-Hsuan Hsu, Kaohsiung (TW); Shou-Gwo Wuu, Hsin-Chu (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 18 days.

(21) Appl. No.: 11/626,757

(22) Filed: Jan. 24, 2007

(65) Prior Publication Data

US 2008/0173963 A1 Jul. 24, 2008

(51) Int. Cl.
*H01L 31/00* (2006.01)
*H01L 23/28* (2006.01)

(52) U.S. Cl. .................. 257/447; 257/460; 257/787
(58) Field of Classification Search ............. 257/447, 257/460, 787
See application file for complete search history.

(56) References Cited

U.S. PATENT DOCUMENTS

| | | | |
|---|---|---|---|
| 4,154,632 A | 5/1979 | Mochizuki et al. | |
| 4,193,826 A | 3/1980 | Mochizuki et al. | |
| 4,199,386 A | 4/1980 | Rosnowski et al. | |
| 4,290,830 A | 9/1981 | Mochizuki et al. | |
| 4,507,674 A | 3/1985 | Gaalema | |
| 4,760,031 A | 7/1988 | Janesick | |
| 5,005,063 A | 4/1991 | Janesick | |
| 5,511,428 A | 4/1996 | Goldberg | |
| 5,792,377 A * | 8/1998 | Belcher et al. | 216/87 |
| 6,012,336 A * | 1/2000 | Eaton et al. | 73/754 |
| 6,168,965 B1 | 1/2001 | Malinovich et al. | |
| 6,169,319 B1 * | 1/2001 | Malinovich et al. | 257/447 |
| 6,227,055 B1 | 5/2001 | Pitzer | |
| 6,429,036 B1 | 8/2002 | Nixon et al. | |
| 6,635,912 B2 | 10/2003 | Ohkubo | |
| 6,765,276 B2 | 7/2004 | Fasen et al. | |
| 6,884,651 B2 | 4/2005 | Toyoda et al. | |
| 7,232,697 B2 * | 6/2007 | Hsu et al. | 438/48 |
| 2005/0090035 A1 | 4/2005 | Kim | |
| 2005/0179053 A1* | 8/2005 | Ezaki et al. | 257/189 |
| 2006/0249803 A1* | 11/2006 | Yamamoto et al. | 257/432 |
| 2006/0281215 A1* | 12/2006 | Maruyama et al. | 438/57 |
| 2007/0255509 A1* | 11/2007 | LeFebvre et al. | 702/33 |
| 2008/0108167 A1* | 5/2008 | Abe et al. | 438/59 |

OTHER PUBLICATIONS

Williams, George M., "Back-Illuminated CCD Imagers for High Information Content Digital Photography", SPIE, vol. 3302, Apr. 1998, pp. 39-53.

* cited by examiner

*Primary Examiner*—Ida M Soward
(74) *Attorney, Agent, or Firm*—Haynes and Boone, LLP

(57) ABSTRACT

The present disclosure provides a backside illuminated semiconductor device. The device includes a substrate having a front surface and a back surface; a plurality of sensor elements formed in the substrate, each of the plurality of sensor elements is designed and configured to receive light directed towards the back surface; and a sensor isolation feature formed in the substrate, and disposed horizontally between two adjacent elements of the plurality of sensor elements, and vertically between the back surface and the front surface.

19 Claims, 2 Drawing Sheets

US 7,485,940 B2

GUARD RING STRUCTURE FOR IMPROVING CROSSTALK OF BACKSIDE ILLUMINATED IMAGE SENSOR

BACKGROUND

In semiconductor technologies, backside-illuminated sensors are used for sensing a volume of exposed light projected towards the backside surface of a substrate. The backside-illuminated sensors can be formed on the front side of the substrate and light projected towards the backside of the substrate can reach the sensors. However, light targeted for one sensor pixel may also have a portion of the light directed toward other pixels, which causes crosstalk among various sensor pixels. Improvements in backside illuminated sensors and/or the corresponding substrate are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
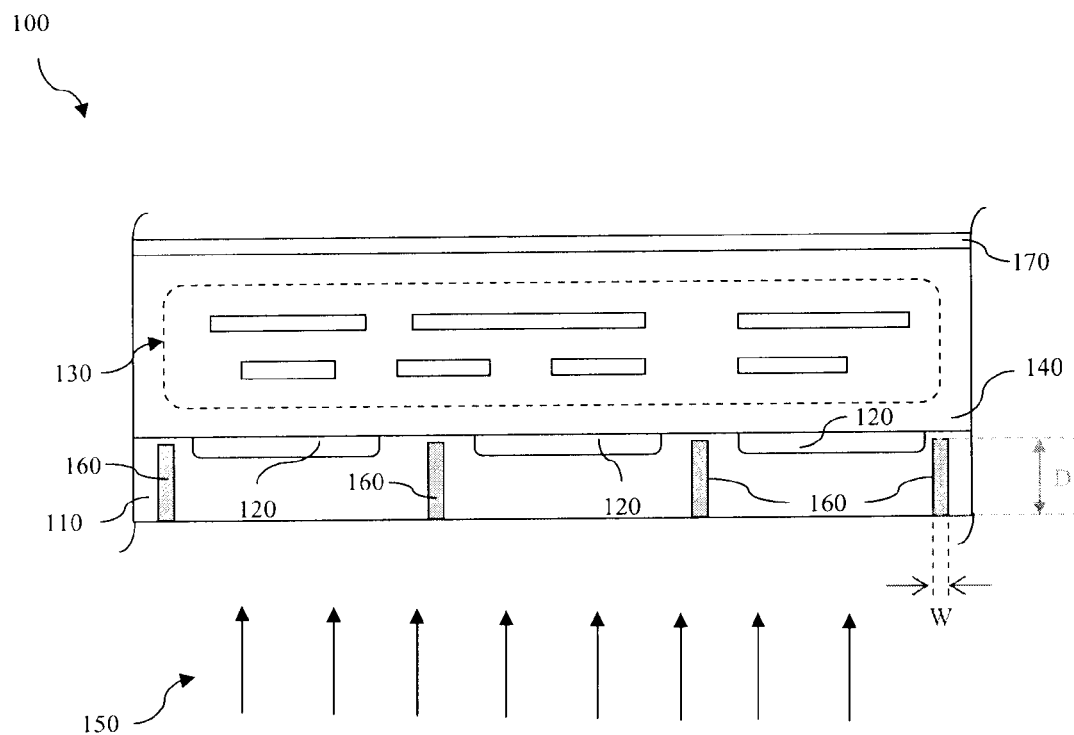
FIG. 1 illustrates a sectional view of one embodiment of a semiconductor device having a plurality of backside illuminated sensors and sensor isolation features constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
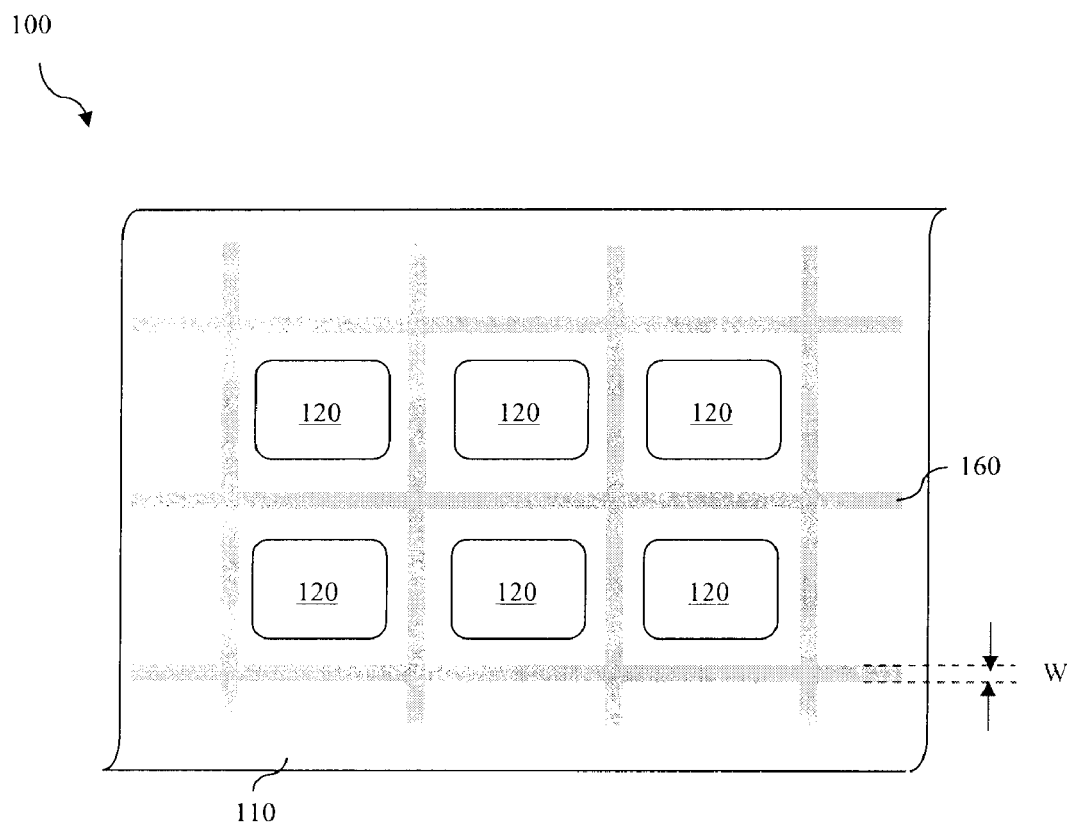
FIG. 2 illustrates a top view of one embodiment of a semiconductor device having a plurality of backside illuminated sensors and sensor isolation features constructed according to aspects of the present disclosure.

FIG. 1 illustrates a sectional view of one embodiment of a semiconductor device 100 having a plurality of backside illuminated (or back-illuminated) sensors and sensor isolation features constructed according to aspects of the present disclosure. FIG. 2 illustrates a top view of one embodiment of the semiconductor device 100 having a plurality of backside illuminated sensors and sensor isolation features formed in the backside of the semiconductor device. Some features in FIG. 1 are not illustrated in FIG. 2 for simplicity and clarification. The semiconductor device 100 will be described with reference to FIGS. 1 and 2.

The semiconductor device 100 includes a semiconductor substrate 110. The substrate 110 includes silicon. The substrate 110 may alternatively or additionally include other elementary semiconductor such as germanium, and diamond. The substrate 110 may also include a compound semiconductor such as silicon carbide, gallium arsenic, indium arsenide, and indium phosphide. The substrate 110 may include an alloy semiconductor such as silicon germanium, silicon germanium carbide, gallium arsenic phosphide, and gallium indium phosphide. The substrate 110 may include various p-type doped regions and/or n-type doped regions. All doping may be implemented using a process such as ion implantation or diffusion in various steps and techniques. The substrate 110 may include conventional isolation features, known in the art, to separate different devices formed in the substrate 110. The substrate 110 may include other features such as an epi layer, a semiconductor on insulator (SOI) structure, or combinations thereof.

The semiconductor device 100 includes sensor elements 120 (or sensor pixels) formed "on" the front surface of the semiconductor substrate 110. In one embodiment, the sensor elements may be disposed over the front surface and extended into the semiconductor substrate 110. In another embodiment, the sensor elements may be disposed above the front surface. The sensor elements 120 each may include a light-sensing region (or photo-sensing region) which may be a doped region having N-type and/or P-type dopants formed in the semiconductor substrate 110 by a method such as diffusion or ion implantation. The light-sensing region may have a doping concentration ranging between about $10^{14}$ and $10^{21}$ atoms/cm$^3$. The light-sensing region may have a surface area ranging between about 10% and 80% area of the associated sensor element, being operable to receive light (or radiation from an object to be imaged) illuminated on. The sensor elements 120 may include photodiodes, complimentary metal-oxide-semiconductor (CMOS) image sensors, charged coupling device (CCD) sensors, active sensor, passive sensor, and/or other sensors diffused or otherwise formed in the substrate 110. As such, the sensor elements 120 may comprise conventional and/or future-developed image sensing devices. The sensor elements 120 may include a plurality of pixels disposed in a sensor array or other proper configuration. The plurality of sensor pixels may be designed having various sensor types. For example, one group of sensor pixels are CMOS image sensors and another group of sensor pixels are passive sensors. Moreover, the sensor elements 120 may include color image sensors and/or monochromatic image sensors. The device 100 is designed to receive light (or radiation) 150 directed towards the back surface of the semiconductor substrate 110 during applications, eliminating obstructing the optical paths by other objects such as gate features and metal lines, and maximizing the exposure of the light-sensing region to the illuminated light. The substrate 110 may be thinned such that the light directed through the back surface thereof may effectively reach the sensor elements 120.

The semiconductor device 100 further includes a multilayer interconnect (MLI) 130 coupled to the sensor elements 120, such that the sensor elements 120 are operable to properly respond to illuminated light (imaging radiation). The multilayer interconnect (MLI) 130 may be formed on the semiconductor substrate 110 and disposed on the front surface overlying the sensor elements 120. The multilayer interconnect may include conductive materials such as aluminum, aluminum/silicon/copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Still other manufacturing processes such as thermal annealing may be used to form metal silicide. Alternatively, copper multilayer interconnect may be used and include copper, copper alloy, titanium, titanium nitride, tantalum, tantalum nitride, tungsten, polysilicon, metal silicide, or combinations. The copper multilayer interconnect may be formed by a technique including CVD, sputtering, plating, or other suitable processes. The metal silicide used in multilayer interconnects may include nickel silicide, cobalt silicide, tungsten silicide, tantalum silicide, titanium silicide, platinum silicide, erbium silicide, palladium silicide, or combinations thereof.

The semiconductor device 100 further includes an interlayer dielectric (inter-level dielectric or ILD) 140 to isolate the multilayer interconnect 130 disposed therein. The interlayer dielectric structure 140 may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD 140 may be formed by a technique including spin-on, CVD, sputtering, or other suitable processes. The MLI 130 and ILD 140 may be formed in an integrated process including a damascene process such as dual damascene processing or single damascene processing.

The semiconductor device 100 further includes sensor isolation feature 160 (radiation isolation feature or sensor guard ring) formed in the substrate 110 and configured to isolate light (radiation, or signal) targeted for each sensor element and minimize the light spreading into other sensor elements. Thus crosstalk among various sensor pixels are reduced or eliminated. Alternatively or additionally, the sensor isolation feature 160 may be designed to reduce electrical crosstalk among various sensor pixels in which an electric signal may be transformed from an imaging radiation signal.

The sensor isolation feature 160 may be disposed horizontally between two adjacent sensor elements in a top view toward the backside of the substrate. The sensor isolation feature 160 may be disposed vertically between the ILD and the backside surface of the substrate 110. In one exemplary embodiment illustrated in FIG. 2, the sensor isolation feature 160 is configured as multiple squares each including one sensor element. The sensor isolation feature 160 may be thin and deep in dimensions such that to occupy less area of the substrate 110 and provide efficient isolation functions. As illustrated in FIGS. 1 and 2, the sensor isolation feature 160 may be disposed between two neighboring sensor elements and have a width ranging between about 0.1 micron and about 10 micron. The sensor isolation feature 160 may be vertically extended substantially between the backside surface and the ILD 140. In one embodiment, the sensor isolation feature 160 may have a depth ranging between about 10% and 90% of the thickness of the semiconductor substrate 110. The semiconductor substrate may have a thickness ranging between about 0.5 micron and about 500 micron for illumination and imaging efficiency. The sensor isolation feature 160 may include a plurality of portions, connected or not connected, disposed in a configuration to substantially eliminate crosstalk between two adjacent sensor elements. For example, the sensor isolation feature 160 may be designed to include a fence structure having a plurality of posts interposed between neighboring sensor elements and disposed around each sensor element.

The sensor isolation feature 160 may include a plug structure filled with a proper material such as air, a dielectric material, an opaque material, a metal material, or combinations thereof. The dielectric material may include silicon oxide, silicon nitride, silicon oxynitride, low k material, or combinations thereof. The opaque material may be any suitable material, such as a black shield material, capable of substantially absorbing any imaging radiation crossing over the sensor isolation feature 160 such as a black shield material. The metal material may include aluminum, copper, tungsten, titanium, titanium nitride, tantalum, tantalum nitride, metal silicide, or combinations thereof. Plug-based sensor isolation feature may function to isolate each sensor element both optically and electrically.

The plug structure can be formed by a series of processing steps. In one embodiment, the substrate is patterned to form a plurality of trenches from the backside surface using processes know in the art or new techniques to be developed in the future. For example, a photoresist layer may be applied on the backside surface of the substrate 110 and patterned using a lithography process. An anisotropic etching technique such as a plasma etching process may be employed to etch the substrate through the openings of the patterned photoresist layer and form a plurality of trenches. The trenches are then filled with a suitable material including dielectric, metal, an opaque material, or combinations thereof. Alternatively, the trenches may remain empty.

The sensor isolation feature 160 may include a doped region having proper dopants. The doping-based sensor isolation feature may function at least to isolate each sensor element electrically. The doped region of the sensor isolation feature 160 may have a doping concentration ranging between about $10^{14}$ atoms/cm$^3$ and $10^{21}$ atoms/cm$^3$. The doped region may be designed applicable for a biasing voltage ranging between about −1 V and 10 V during operation. Alternatively, the doped region may be designed and configurable for being electrically floating during operation. The doped region of the sensor isolation feature may be formed by a method known in the art such as ion implantation. As one example, boron may be used as dopants to form the doped region in the sensor isolation feature 160. A doped region and a plug may be alternatively or collectively used for the purpose if necessary.

The device 100 may include a passivation layer 170 disposed over the MLI and ILD. The device 100 may further include a transparent layer attached to the back surface of the semiconductor substrate 110 to mechanically support thereof and optically allow the backside-illuminated light passing through. The device 100 may include color filters interposed between the sensor elements 120 and the back surface of the semiconductor substrate 110 for color imaging applications. The device 100 may include a plurality of micro-lens interposed between the sensor elements 120 and the back surface of the semiconductor substrate 110, or between the color filters and the back surface if the color filters are implemented, such that the backside-illuminated light can be focused on the light-sensing regions. The sensor isolation feature 160 may be formed by various processes compatible and integral to the conventional processing technologies.

In the disclosed structure and the method to make the same, the illuminated light during applications may not be limited to visual light beam, it can be extended to other optical light such as infrared (IR) and ultraviolet (UV), and other proper radiation beam. Accordingly, the sensor isolation feature 160 may be properly chosen and designed to effectively reflect and/or absorb the corresponding radiation beam.

Thus, the present disclosure provides a backside illuminated semiconductor device. In one embodiment, the device includes a substrate having a front surface and a back surface, with a plurality of sensor elements formed in the substrate. Each of the plurality of sensor elements is designed and configured to receive light directed towards the back surface. The device also includes a sensor isolation feature formed in the substrate and disposed horizontally between two adjacent sensor elements of the plurality of sensor elements, and vertically between the back surface and the front surface.

In some embodiments, the sensor isolation feature may be designed to reduce at least one of optical and electrical interferences between the two adjacent elements. The sensor isolation feature may include a doped region. The doped region may include a doping concentration ranging between about $10^{14}$ atoms/cm$^3$ and $10^{21}$ atoms/cm$^3$. The sensor isolation feature may be designed and configurable for a biasing voltage ranging from about −1 V to 10 V during operation. The sensor isolation feature may be alternatively designed and configurable for being electrically floating during operation.

In some embodiments, the sensor isolation feature may include a plug. The plug may be filled with a material selected from the group consisting of air, a dielectric material, an opaque material, a metal material, and combinations thereof. The metal material may be selected from the group consisting of aluminum, copper, tungsten, titanium, titanium nitride, tantalum, tantalum nitride, metal silicide, and combinations thereof. The dielectric material may be selected from the group consisting of silicon oxide, silicon nitride, silicon oxynitride, low k material, and combinations thereof.

In some embodiments, the sensor isolation feature may include a width ranging between about 0.1 micron and about 10 micron. The sensor isolation feature may include a depth ranging between about 10% and 90% of the thickness of the substrate. The substrate may include a thickness ranging between about 0.5 micron and about 500 micron. The substrate may include a portion selected from the group consisting of an epi layer, a semiconductor on insulator (SOI) structure, and combinations thereof. Each of the plurality of sensor elements may be selected from the group consisting of complementary metal-oxide-semiconductor (CMOS) image sensor, charge-coupled device sensor, active pixel sensor, passive pixel sensor, and combinations thereof.

In another embodiment, the device includes a semiconductor substrate having a front surface and a back surface; a sensor element disposed in the front surface; a conductive interconnect feature disposed on the front surface, overlying the sensor element; and a sensor isolation feature formed in the semiconductor substrate. The sensor isolation feature is disposed horizontally around the sensor element and vertically between the back surface and the conductive interconnect feature.

In one embodiment, the sensor isolation feature may include a material selected from the group consisting of air, a dielectric material, an opaque material, a metal material, a doped material, and combinations thereof. The sensor isolation feature may be configured to substantially include the sensor element in top view perpendicular to the semiconductor device. The device may further include a microlens disposed on the back surface, and designed to receive radiation towards the back surface and direct the radiation to the sensor element.

The present disclosure also provides a method to fabricate a semiconductor device. In one embodiment, the method includes providing a semiconductor substrate having a front surface and a back surface; forming a sensor element in the front surface; forming conductive interconnect on the front surface, overlying the sensor element; and forming a sensor isolation feature in the semiconductor substrate, disposed horizontally around the sensor element and vertically between the back surface and the conductive interconnect.

In one embodiment of the method, the forming of the sensor isolation feature may include forming a plug filled with a material selected from the group consisting of air, a dielectric material, an opaque material, a metal material, and combinations thereof. The forming of the sensor isolation feature may include forming a doped region.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A backside illuminated semiconductor device, comprising:
    a substrate having a front surface and a back surface;
    a plurality of sensor elements formed in the substrate, each of the plurality of sensor elements designed and configured to receive light directed towards the back surface; and
    a sensor isolation feature formed in the substrate, and disposed horizontally between two adjacent sensor elements of the plurality of sensor elements, and vertically between the back surface and the front surface.

2. The device of claim 1, the sensor isolation feature is designed to reduce at least one of optical and electrical interferences between the two adjacent elements.

3. The device of claim 1, wherein the sensor isolation feature comprises a doped region.

4. The device of claim 3, wherein the doped region comprises a doping concentration ranging between about $10^{14}$ atoms/cm$^3$ and $10^{21}$ atoms/cm$^3$.

5. The device of claim 3, wherein the sensor isolation feature is designed and applicable for a biasing voltage ranging from about −1 V to 10 V during operation.

6. The device of claim 3, wherein the sensor isolation feature is designed and configurable for being electrically floating during operation.

7. The device of claim 1, wherein the sensor isolation feature comprises a plug.

8. The device of claim 7, wherein the plug is filled with a material selected from the group consisting of air, a dielectric material, an opaque material, a metal material, and combinations thereof.

9. The device of claim 8, wherein the metal material is selected from the group consisting of aluminum, copper, tungsten, titanium, titanium nitride, tantalum, tantalum nitride, metal silicide, and combinations thereof.

10. The device of claim 8, wherein the dielectric material is selected from the group consisting of silicon oxide, silicon nitride, silicon oxynitride, low k material, and combinations thereof.

11. The device of claim 1, wherein the sensor isolation feature comprises a width ranging between about 0.1 micron and about 10 micron.

12. The device of claim 1, wherein the sensor isolation feature comprises a depth ranging between about 10% and 90% of the thickness of the substrate.

13. The device of claim 1, wherein the substrate comprises a thickness ranging between about 0.5 micron and about 500 micron.

14. The device of claim 1, wherein the substrate comprises a portion selected from the group consisting of an epi layer, a semiconductor on insulator (SOI) structure, and combinations thereof.

15. The device of claim 1, wherein each of the plurality of sensor elements is selected from the group consisting of complementary metal-oxide-semiconductor (CMOS) image sensor, charge-coupled device sensor, active pixel sensor, passive pixel sensor, and combinations thereof.

16. A semiconductor device, comprising:
a semiconductor substrate having a front surface and a back surface;
a sensor element disposed in the front surface;
a conductive interconnect feature disposed on the front surface, overlying the sensor element; and
a sensor isolation feature formed in the semiconductor substrate, disposed horizontally around the sensor element and vertically between the back surface and the conductive interconnect feature.

17. The device of claim 16, wherein the sensor isolation feature comprises a material selected from the group consisting of air, a dielectric material, an opaque material, a metal material, a doped material, and combinations thereof.

18. The device of claim 16, wherein the sensor isolation feature is configured to substantially include the sensor element in top view perpendicular to the semiconductor device.

19. The device of claim 16, further comprising a microlens disposed on the back surface, and designed to receive radiation towards the back surface and direct the radiation to the sensor element.

* * * * *